(12) United States Patent
Stewart et al.

(10) Patent No.: US 7,187,552 B1
(45) Date of Patent: Mar. 6, 2007

(54) SELF-INSTALLING HEAT SINK

(75) Inventors: Thomas E. Stewart, Saratoga, CA (US); Timothy W. Olesiewicz, Dublin, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 80 days.

(21) Appl. No.: 11/072,977

(22) Filed: Mar. 4, 2005

(51) Int. Cl.
H05K 7/20 (2006.01)

(52) U.S. Cl. .................. 361/704; 361/702; 361/709; 361/710; 361/719; 439/330; 439/331

(58) Field of Classification Search .............. 361/704, 361/690, 688, 707, 710–719, 720–721; 257/717–721; 439/73, 266, 330, 70, 71, 331, 152, 154, 439/487; 165/80.3, 185; 324/755, 765, 324/756–758
See application file for complete search history.

(56) References Cited

U.S. PATENT DOCUMENTS

| | | | |
|---|---|---|---|
| 5,161,087 A * | 11/1992 | Frankeny et al. | 361/702 |
| 5,380,213 A * | 1/1995 | Piorunneck et al. | 439/160 |
| 5,865,639 A * | 2/1999 | Fuchigami et al. | 439/330 |
| 5,966,287 A | 10/1999 | Lofland et al. | |
| 5,966,289 A * | 10/1999 | Hastings et al. | 361/704 |
| 6,086,387 A * | 7/2000 | Gallagher et al. | 439/71 |
| 6,213,806 B1 * | 4/2001 | Choy | 439/331 |
| 6,447,322 B1 * | 9/2002 | Yan et al. | 439/331 |
| 6,634,890 B2 | 10/2003 | Peterson et al. | |
| 6,746,270 B2 | 6/2004 | Peterson et al. | |
| 6,945,792 B2 * | 9/2005 | Hayakawa | 439/73 |
| 7,007,741 B2 | 3/2006 | Sen et al. | |
| 7,030,638 B2 * | 4/2006 | Stutzman | 324/765 |
| 2003/0032322 A1 * | 2/2003 | Nakamura et al. | 439/330 |

FOREIGN PATENT DOCUMENTS

JP 410107468 A * 4/1998

* cited by examiner

*Primary Examiner*—Michael Datskovskiy
(74) *Attorney, Agent, or Firm*—Meyertons Hood Kivlin Kowert & Goetzel, P.C.; B. Noël Kivlin; Chris D. Thompson

(57) ABSTRACT

A circuit board assembly may include a heat sink that couples with a surface a circuit module installed on the circuit board. The heat sink may automatically couple to the surface of the circuit module when the circuit module is installed on the circuit board. The heat sink may include a thermal interface element that contacts the surface of the circuit module. A biasing element may be coupled between the body and the base to urge a body of the heat sink into contact with the circuit module when the circuit module is installed on the circuit board. In some embodiments, a heat sink may automatically couple with the circuit module when a locking member for the circuit module is actuated to a closed position. In some embodiments, a heat sink may automatically couple with a circuit module when an ejector for the circuit module is actuated. In some embodiments, a heat sink may include an ejector and a locking member for a circuit module.

22 Claims, 7 Drawing Sheets

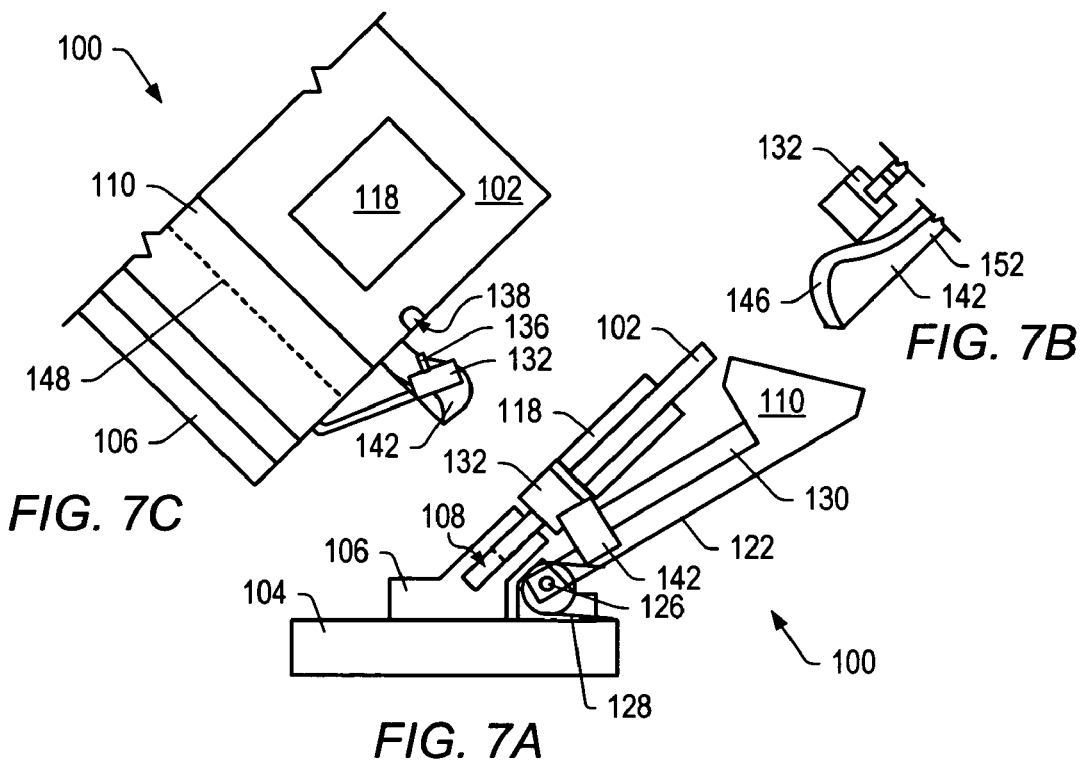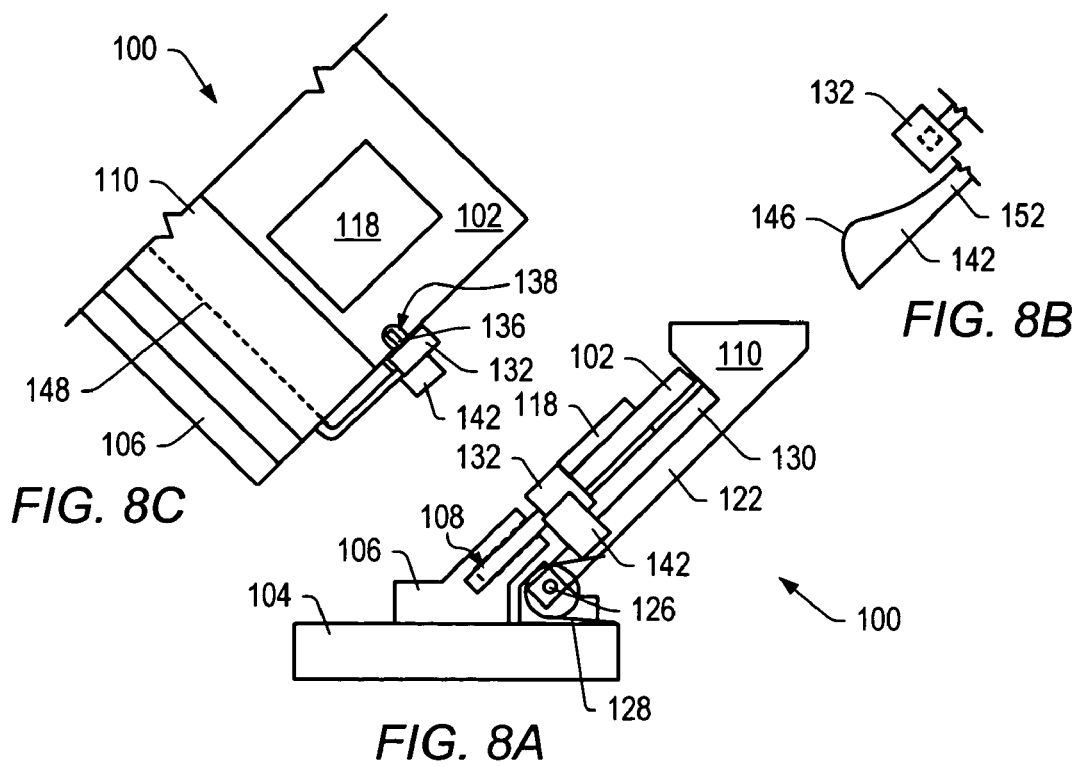

SELF-INSTALLING HEAT SINK

BACKGROUND OF THE INVENTION

1. Field of the Invention

This invention relates generally electronic equipment, such as computers, and, more particularly, to apparatus and methods for cooling circuit modules such as dual inline memory modules.

2. Background Information

Computer systems often require high reliability and high capacity of operation. Various approaches have been taken to providing such high-performance, high reliability systems. High density systems are typically rack mountable, with one or more processor modules occupying a prescribed space (e.g., a vertical slot) in the rack. A trend in recent times is to make the computers with smaller form factors. This means that more processors can be located in a rack. This has the advantage of increasing the processing density within the racks, and also the advantage of reducing the distance between the computer systems.

Components of computer systems may generate substantial amounts of heat during operation. Higher operating temperatures in electronic components are associated with decreased reliability of the components. To address this issue, some systems include fans or blowers to force air over the heat-generating components to cool the components.

Random access memory for computer systems is often provided in modularized form, such as in dual in-line memory modules (DIMMs). A circuit board may have an array of parallel sockets, or "slots", each of which receives one memory module. In some cases, the sockets may be angled such that the memory modules are situated at an acute angle with respect to the plane of the circuit board. The sockets are generally spaced close together, so air flow velocity across the sides of the memory modules may be relatively low. In addition, because of the close spacing, heat generated by components on one memory module may reduce cooling of adjacent memory modules.

Heat sinks may be attached to components to facilitate heat dissipation from the components. A heat sink is typically made of a thermally conductive material, such as aluminum, with a plurality of fins or pins on an exposed side of the heat sink. Heat is dissipated from the fins or pins to the surrounding air principally by thermal convection.

In some cases, application of conventional heat sinks to surfaces of angled memory modules may be impractical. Moreover, the use of conventional heat sinks for memory modules may increase complexity of a system. Different suppliers provide memory modules having different form factors. Thus, a heat sink for one memory module may not be suitable for use with another memory module. In some cases, a memory module supplier may bear the burden of providing a heat sink that is compatible with its memory module. In other cases, a computer manufacturer may need to add a heat sink to each memory module during installation of the modules.

Components such as memory modules are commonly added or replaced in systems that are already in service. Adding or replacing a memory module in a system may require removal of a heat sink to access an open socket or the failed memory module. Alternatively, if a heat sink is permanently attached to a failed memory module, the heat sink on the failed module must be replaced along with the module.

SUMMARY OF THE INVENTION

In an embodiment, a circuit board assembly may include a heat sink that couples with a surface a circuit module installed on the circuit board. The heat sink may automatically couple to the surface of the circuit module when the circuit module is installed on the circuit board. A circuit module may be installed in a socket such that the circuit modules are situated at an acute angle relative to the circuit board (e.g., an angled dual in-line memory module socket). In some embodiments, a circuit board assembly may include a heat sink that is coupled to the lower side of one of two adjacent angled circuit modules. In certain embodiments, a heat sink may include a heat pipe.

In some embodiments, a heat sink may include a thermal interface element that contacts the surface of the module. The thermal interface material may at least partially conform to one or more components (e.g., memory devices) on the circuit module. The thermal interface material may contact devices of different heights on a circuit module.

In some embodiments, the heat sink mounted on circuit board may include a body pivotally coupled to a base. A biasing element may be coupled between the body and the base to urge the body into contact with a circuit module when the circuit module is installed on the circuit board.

In an embodiment, a circuit board assembly may include a locking member that inhibits removal of a circuit module from the circuit board. A heat sink may automatically couple with the circuit module when the locking member is actuated to a closed position. In certain embodiments, the locking member may engage a cam element on the heat sink to decouple the body of the heat sink from the circuit module when the locking member is placed in an open position.

In an embodiment, an ejector may be coupled to a heat sink. The ejector may automatically eject the circuit module when a body of the heat sink is decoupled from the circuit module. The ejector may engage the circuit module when the circuit module is installed such that the heat sink couples with a surface of the circuit module. In certain embodiments, the ejector may be part of a locking member.

In some embodiments, a heat sink may include a locking member. The locking member may enter an open position the body of the heat sink is decoupled from the circuit module and the circuit module is ejected from the circuit board. In certain embodiments, a heat sink may include both a locking member and an ejector.

In an embodiment, a circuit board assembly may include a holding device for a heat sink. The holding device may maintain the heat sink in an open position during installation and/or removal of a circuit module. The holding device may be releasable by a user to couple a body of the heat sink with the circuit module.

BRIEF DESCRIPTION OF THE DRAWINGS

Other aspects of the invention will become apparent upon reading the following detailed description and upon reference to the accompanying drawings in which:

FIGS. 7A–7C depict a circuit module during installation on a circuit board.

FIGS. 8A–8C depict a circuit module after installation on a circuit board.

Figure 1:
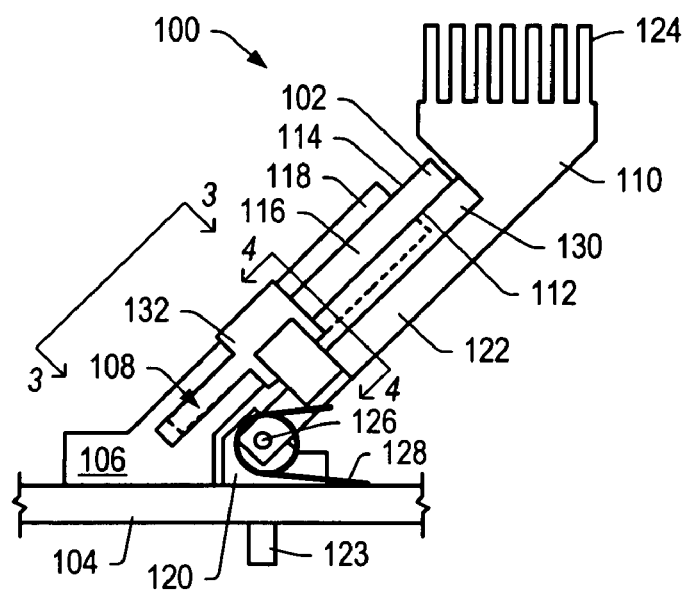
FIG. 1 is a side view of a system including an angled circuit module and a circuit board-mounted heat sink.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

The following description generally relates to computer apparatus and methods for mounting and cooling computer system components such as memory modules. Such systems and methods may be used in a variety of applications. A non-exhaustive list of such applications includes: telecommunications network server systems; e-commerce web server systems; LAN application and file server systems; personal computer systems; and remote vehicle control systems.

As used herein, "module" includes any modular unit or subsystem. Examples of a module include, but are not limited to, a memory module, a printed circuit board assembly, an information processing cartridge, a power supply, or a combination thereof. In certain embodiments, a module may include multiple circuit boards (e.g., a mezzanine card mounted to a main circuit board). Modules may be various shapes, including, but not limited to, rectangular, triangular, or an irregular shape. In certain embodiments, components of a module may be housed in an enclosure. Sides of an enclosure for a module may include perforations or other openings to allow for a flow of cooling air through the enclosure.

As used herein, "circuit module" includes any module that includes or carries elements of an electrical circuit, electrical components (including, but not limited to, semiconductor devices, resistors, capacitors, relays, switches, and connectors), or conductors (e.g., wires, traces). Examples of circuit modules include, but are not limited to, dual in-line memory modules (DIMMs) (e.g., dual data rate (DDR)), single in-line memory modules (SIMMs), circuit boards, and integrated circuit devices. As used herein, "circuit board" includes any circuit module that carries one or more other circuit modules or components. "Circuit board" includes, but is not limited to, a printed circuit board made of epoxy-glass and metal layers. As used herein, "component" includes any element of system, including, but not limited to, a printed circuit board, a semiconductor device, a resistor, or a capacitor, a power supply, or a disk drive.

As used herein, "enclosure" includes any structure that supports or houses one or more elements of a computer system (e.g., electronic modules). A module may be supported in an enclosure by various structures including, but not limited to, slides, rails, a shelf, or a bottom wall of an enclosure.

As used herein, "member" includes a single member or a combination of members. Portions of a member may be straight and/or curved, flexible and/or rigid, or a combination thereof. As used herein, "coupled" includes a direct coupling or an indirect coupling (e.g., with one or more intervening elements) unless expressly stated otherwise. For example, a heat sink may be coupled to a socket by directly attaching the heat sink to the socket, or by connecting the heat sink and the socket to one or more intervening elements (e.g., a bracket, a printed circuit board).

Figure 2:
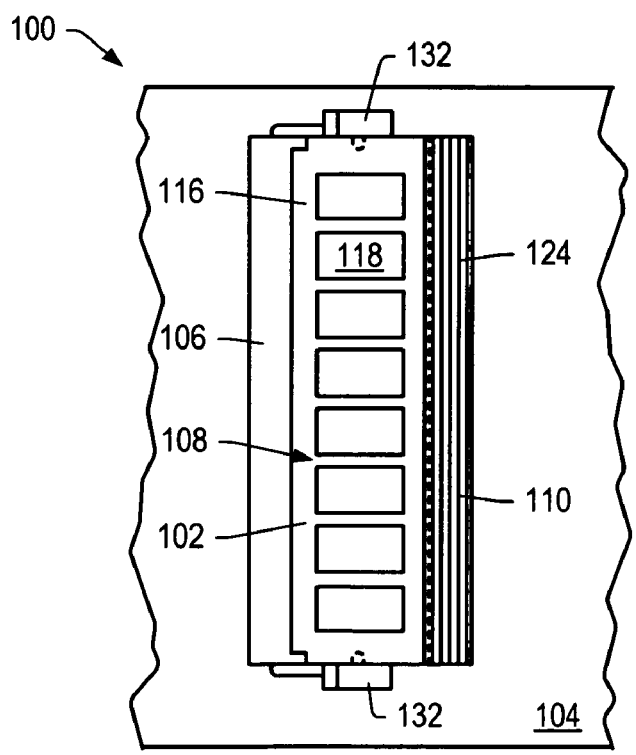
FIG. 2 is a top view of a system including an angled circuit module and a circuit board-mounted heat sink.

FIG. 1 depicts a side view of system 100 including circuit module 102 coupled to circuit board 104. FIG. 2 depicts a top view of circuit module 102 coupled to circuit board 104. Circuit board 104 may include socket 106. Socket 106 may include slot 108 for receiving circuit module 102. As shown in FIG. 1, socket 106 may in some embodiments be angled such that circuit module 102 is at an acute angle with respect to a plane of circuit board 104. An angled socket may provide a lower profile for a circuit board assembly. In other embodiments, a socket may orient a circuit module in other orientations with respect to a circuit board (e.g., perpendicular).

Heat sink 110 may be coupled to circuit board 104 to facilitate cooling of components of circuit module 102. Attaching a heat sink for a circuit module to a circuit board may advantageously allow for replacement of the circuit module without replacing the heat sink. As shown in FIG. 1, heat sink 110 may couple with lower side 112 of circuit module 102. In other embodiments, heat sink 110 may couple with upper side 114 of circuit module 102. As used herein, "heat sink" includes any element or combination of elements that facilitates or promotes dissipation of heat from one or more components of a system. A heat sink may include, or be coupled to, other elements of a system, such as ejectors, fasteners, mounting brackets, handles, or locking members.

Circuit module 102 may include module board 116 and devices 118. Module board 116 may be a circuit board that provides connections between circuit board 104 and devices 118. Devices 118 may include any of various electronic components, such as memory chips, central processing units, power regulation devices, or resistors. Packaging of devices 118 may take various forms, including, but not limited to, dual in-line pin, pin grid array, or ball grid array. In some embodiments, devices 118 may be installed on only one side of module board 116. The dimensions (e.g., height, width, and depth) of various devices 118 on module board 116 may be the same or different.

Heat sink 110 may include base 120 and body 122. Base 120 may be coupled to circuit board using various methods including, but not limited to, soldering, screws, rivets, pins, or adhesive. As shown in FIG. 1, base 120 in some embodiments be attached to circuit board 104 by way of fastener 123. In certain embodiments, a base for a heat sink may be integral with a socket for a circuit module.

Heat sink 110 may include extruded fins 124 to facilitate flow of cooling air over or through portions of the heat sink and promote rejection of heat from components of circuit module 102 into the cooling air. In other embodiments, other elements such as pins, radial fins, or folded fins may be used instead of extruded fins 124. As shown in FIG. 1, body 122 may be pivotally coupled to base 120 on pivot pin 126. In certain embodiments, a base and a body of a heat sink may be coupled for other types of relative movement, such as translation. For example, a body of a heat sink may slide on a base upward and downward relative to a circuit board, or slide side-to-side relative to a circuit board.

Heat sink 110 may include torsion spring 128. Torsion spring 128 may be coupled to base 120 and body 122. Torsion spring 128 may serve as a biasing element to urge body 122 toward circuit module 102 when circuit module 102 is installed in socket 106. Other examples of biasing elements include, but are not limited to, flat springs, compression springs, and elastomeric members. In certain embodiments, a biasing element may be integrally formed with a base of a heat sink, a body of a heat sink, or both. For example, a base of a heat sink formed of spring steel may include a spring portion that couples to a body of the heat sink and urges the body into engagement with a circuit module.

Heat sink 110 may include thermal interface element 130. Thermal interface element 130 may be various heat-conducting materials, such as a phase change material or an adhesive. In some embodiments, thermal interface element 130 may be made of a resilient material such as an elastomeric pad. Thermal interface material 130 may be compressed when heat sink 110 is coupled to circuit module 102. Compression of thermal interface element 130 may increase contact pressure at the interface between devices 118 and thermal interface element 130, thereby reducing thermal contact resistance and promoting rejection of heat from the devices.

A resilient thermal interface material may conform to devices having different dimensions (e.g., heights, widths) or spacing. Thus, a resilient thermal interface element may promote good contact with various devices of different heights on a particular module board. A resilient thermal interface element may also allow interchangeability of circuit modules having different device dimensions and/or locations. For example, a resilient thermal interface element may allow a memory module supplied by one vendor to be replaced by a memory module supplied by another vendor who uses larger or smaller memory chips.

Figure 3:
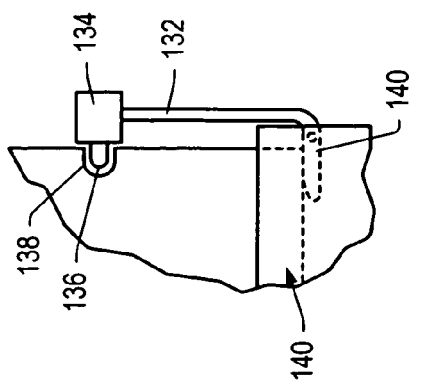
FIG. 3 is a view of a locking lever for a circuit module substantially in the direction of lines 3—3 in FIG. 1.

In some embodiments, a modular system may include locking members for a circuit module. The locking members may inhibit removal of the circuit module from a circuit board. As used herein, "locking member" includes any member that can be positioned to inhibit removal of an element unless a specified action (e.g., depressing a tab, turning a knob) is performed. FIG. 3 depicts a portion of system 100 including locking levers 132. Locking levers 132 may be pivotally coupled to socket 106. Locking levers 132 may include grip portions 134 and protrusions 136. Protrusions 136 may extend into notches 138 on module board 116 when locking levers 132 are in a closed position. Engagement of protrusions 136 in notches 138 may inhibit circuit module 102 from being removed from circuit board 104. In certain embodiments, locking levers 132 may be dimensioned in accordance with a standard for DIMMs.

In some embodiments, a system may include ejectors for a circuit module. As used herein, "ejector" includes any element or elements that may be used to eject a component from or inject a component into a system. As used herein, to "eject" generally means to decouple a component from a system or another component. As used herein, to "inject" generally means to couple one component to a system or another component. Examples of ejectors include, but are not limited to, levers, screws, rods, cams, hooks, or pins. In some embodiments, an ejector and a locking member may each be a separate element. In other embodiments, an ejector and locking member may be integrated into a single element. For example, locking lever 132 may include ejector portion 140. Ejector portion 140 may eject circuit module 102 from socket 106 when locking lever 132 is rotated away from circuit module 102.

Figure 4:
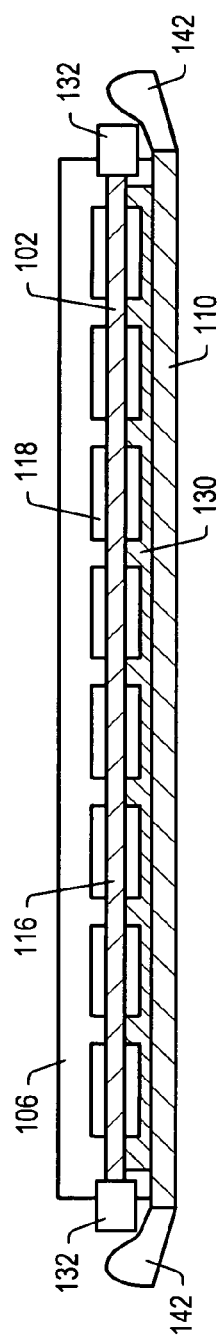
FIG. 4 is a cross sectional view of a circuit module and heat sink taken substantially along lines 4—4 in FIG. 1.

In some embodiments, a heat sink may include elements that interact with locking members and/or ejectors for a circuit module. FIG. 4 depicts a cross sectional view of circuit module 102 and heat sink 110. Heat sink 110 may include cam elements 142. As locking members 132 are rotated outwardly by a user from circuit module 102, protrusions 136 on locking levers 132 may move out of notches 138 such that circuit module 102 is unlocked from circuit board 104. Simultaneously, locking levers 132 may engage cam elements 142 on heat sink 110. As used herein, "engage" or "engaging" includes any condition in which one element engages (e.g., contacts) another element during operation or use of an apparatus. Locking members 132 may displace cam elements 142 such that heat sink 110 moves away from slot 108 (shown in FIG. 1). When heat sink 110 is positioned away from slot 108, a circuit module may be installed, removed and/or replaced.

Figure 5:
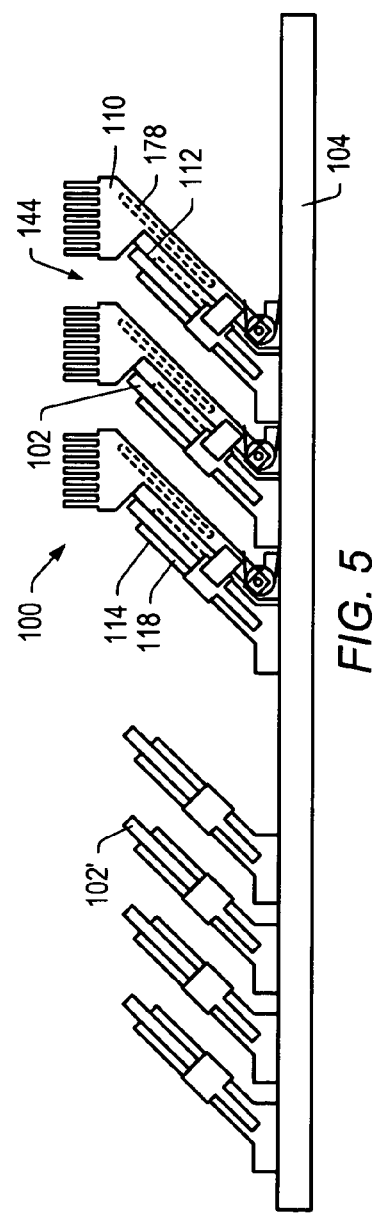
FIG. 5 is a side view of an array of angled circuit modules on a circuit board.

FIG. 5 depicts system 100 including multiple circuit modules 102 coupled to circuit board 104. In some embodiments, heat sinks 110 may be provided for each circuit module 102 in the system. In other embodiments, heat sinks 110 may be provided for only a subset of circuit modules 102. As shown in FIG. 5, heat sinks 110 may be coupled to lower sides 112 of circuit modules 102. Coupling heat sinks 110 to lower sides 112 may improve cooling effectiveness in gaps 144 between circuit modules 102, where velocities of cooling air may be low. Providing heat sinks 110 between adjacent circuit modules 102 may reduce cross heating between adjacent circuit modules 102. For example, if circuit modules 102 and 102' have the same components and power densities, the ambient air temperature at the surface of a given component on upper side 114 of circuit modules 102 may be lower than the ambient air temperature at the surface of a corresponding component on upper side 114 of circuit modules 102'.

In certain embodiments, a system may provide for forced cooling air of components in a system. Cooling air devices such as blowers or fans may be provided internal or external to an enclosure. In certain embodiments, a system may include elements to control the flow of cooling air through a housing. For example, plenums and/or filler panels may be installed to guide airflow in an enclosure. In one embodiment, air is forced across heat sinks 110 shown in FIG. 5.

Figures 6A, 6B, 6C:
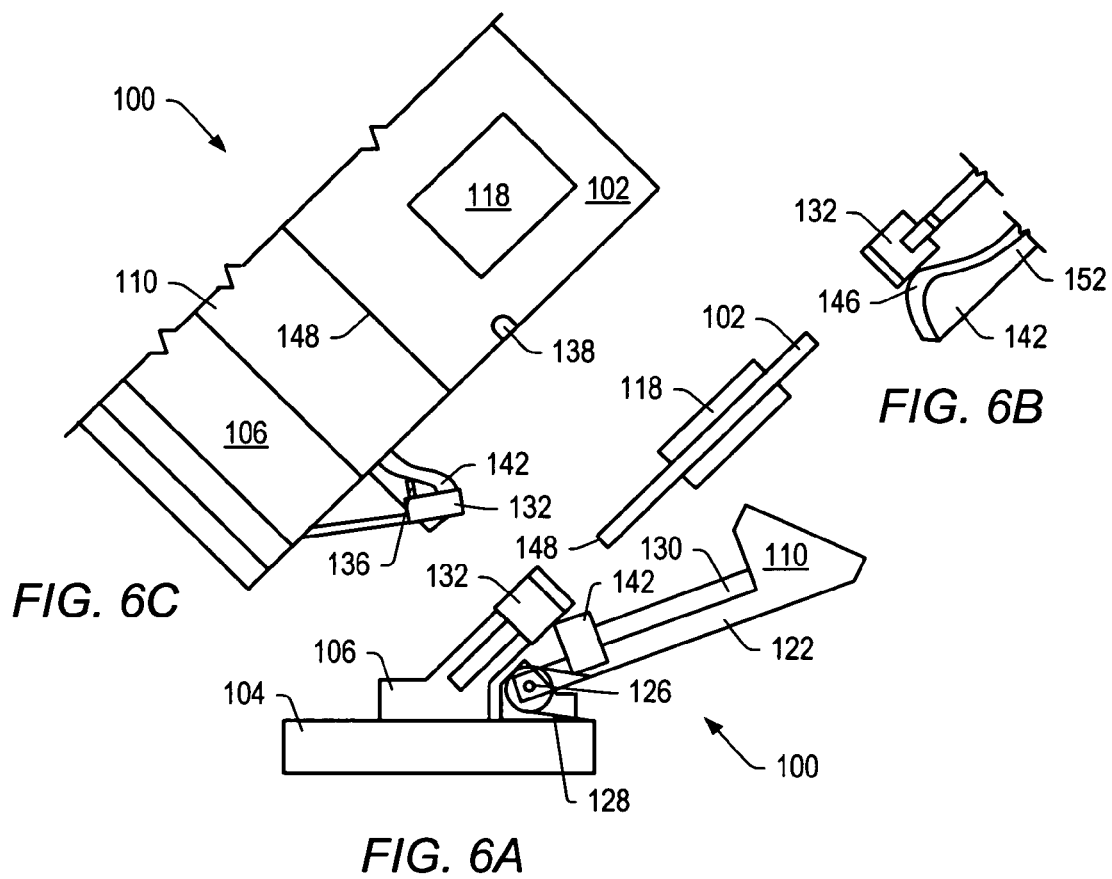
FIGS. 6A–6C depict a circuit module before installation on a circuit board.

FIGS. 6A–6C depict system 100 before installation of circuit module 102 on circuit board 104. Locking levers 132 may be an open position. Locking levers 132 may be engaged on enlarged portion 146 of cam elements 142 on heat sink 110 such that heat sink 110 is held in an open position. Circuit module 102 may be advanced toward socket 106.

FIGS. 7A–7C depict system 100 during installation of circuit module 102 on circuit board 104. Circuit module 102 may be advanced into slot 108 in socket 106. Bottom edge 148 of circuit module 102 may engage ejector portions 140 of locking levers 132 (shown in FIG. 3). Locking levers 132 may rotate toward circuit module 102. Locking levers 132 may move away from enlarged portion 146 of cam elements 142 and toward reduced portion 152 of cam elements 142, thereby allowing body 122 of heat sink 110 to move toward circuit module 102 under the force of torsion spring 128.

FIGS. 8A–8C depict system 100 after installation of circuit module 102. Protrusions 136 of locking levers 132 may enter notches 138 of circuit module 102. Locking levers 132 may disengage from cam elements 142. Body 122 of heat sink 110 may couple with lower side 112 of circuit module 102 under the force of torsion spring 128.

To remove circuit module 102 from circuit board 104, the steps described above relative to FIGS. 6A–8C may be reversed. Locking levers 132 may be actuated by a user to unlock circuit module 102 from socket 106 and eject circuit module 102 from the socket (FIG. 7C). As the locking levers are actuated, locking levers 132 may engage on cam elements 142, driving body 122 of heat sink 110 away from circuit module 102 against the force of torsion spring 128 (FIGS. 7A–7B). In some embodiments, displacement of cam elements 142 may be sufficient to allow circuit module 102 to clear socket 106. In other embodiments, a user may be required to manually displace body 122 of heat sink 110 beyond the limits of cam elements 142 to permit removal of circuit module 102.

In the embodiments described above relative to FIGS. 6A–8C, locking levers 132 engage cam elements 142 during both installation and removal of the circuit module such that heat sink 110 couples with and decouples from circuit module 102 without any separate operations by a user. A self-installing heat sink may advantageously eliminate a need for a user to perform a separate operation to install a heat sink on a circuit module, thereby streamlining the manufacturing process. In addition, eliminating a separate heat sink installation step may reduce a risk of manufacturing defects in a system. It will be understood, however, that in other embodiments a heat sink may be coupled to a circuit module by separate user action.

Figure 10:
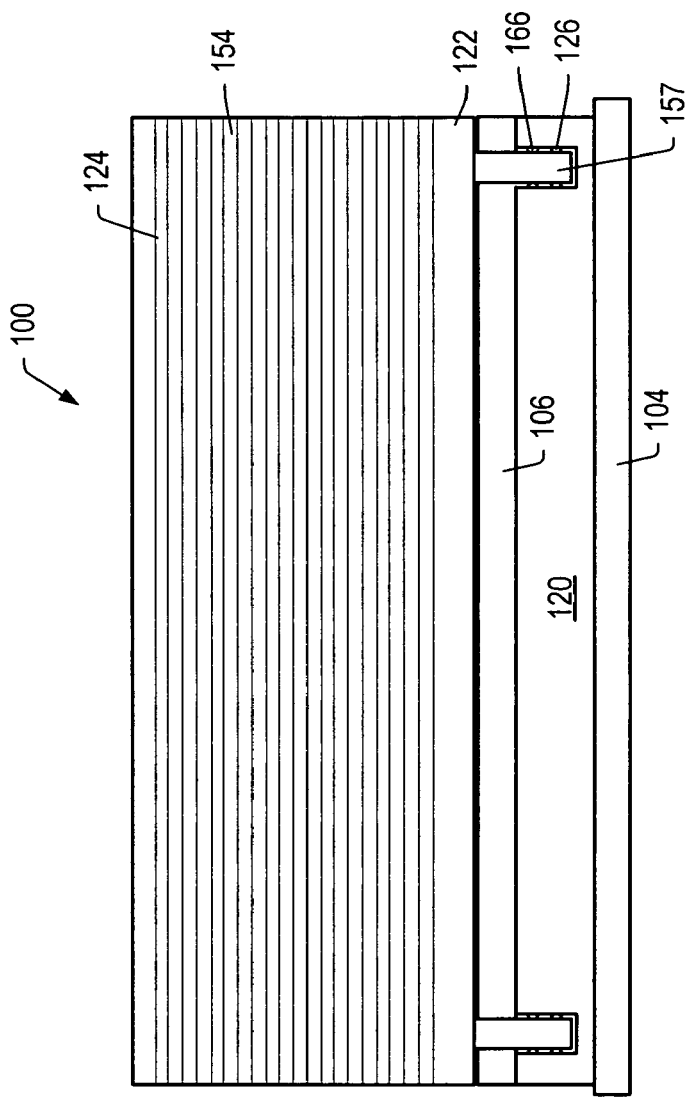
FIG. 10 is a front view of the system shown in FIG. 9.
Figure 9:
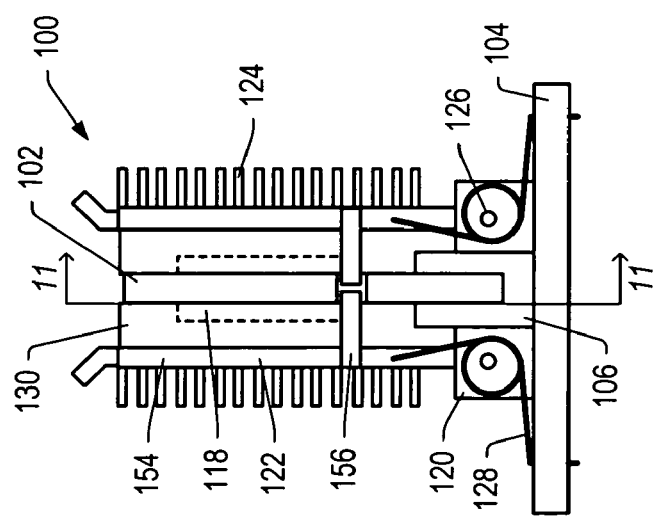
FIG. 9 is a side view of a system including a pair of opposing heat sinks on a circuit module.

In some embodiments, a heat sink may include an ejector for a circuit module, a locking member for a circuit module, or both. FIG. 9 depicts a side view of system 100 including circuit module 102 on circuit board 104. FIG. 10 depicts a front view of circuit module 102 on circuit board 104. Heat sinks 154 may be coupled to either side of circuit module 102 to promote rejection of heat components of the circuit module. Heat sink 154 may include base 120, body 122, thermal interface element 130, torsion spring 128, and fins 124 similar to those described relative to FIG. 1. Body 122 may include tabs 157 for pivotally connecting body 122 with base 120.

Figure 11:
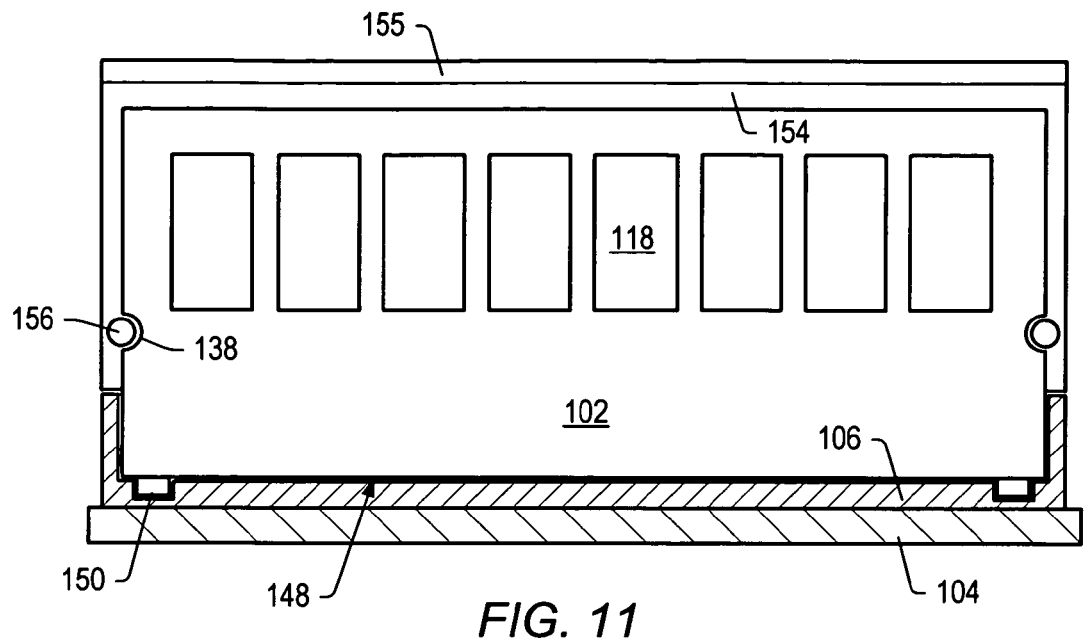
FIG. 11 is a cross sectional view of a system taken substantially along lines 11—11 of FIG. 9.

FIG. 11 depict a cross sectional view of system 100 shown in FIG. 10. Heat sink 154 may include pins 156. Pins 156 may serve as locking members to inhibit removal of circuit module 102 from socket 106 when heat sink 154 is coupled to circuit module 102. For example, pins 156 may engage in notches 138 of circuit module 102. In one embodiment, notches 138 may be located and sized according to a standard for DIMMs. In other embodiments, notches 138 may be customized for a particular heat sink.

Figure 12:
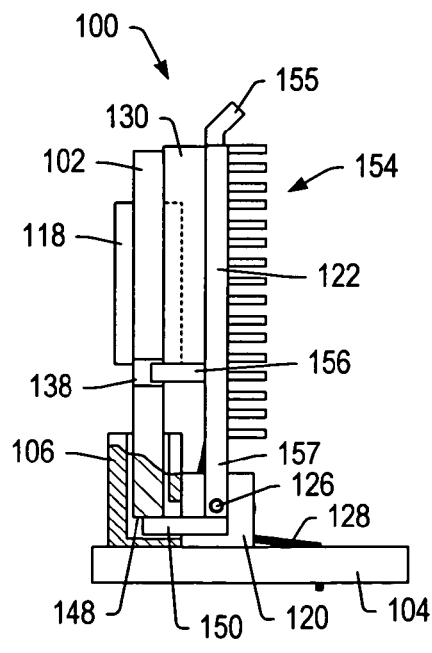
FIG. 12 is a cutaway view of the heat sink shown in FIG. 9 with the heat sink in a closed position.
Figure 13:
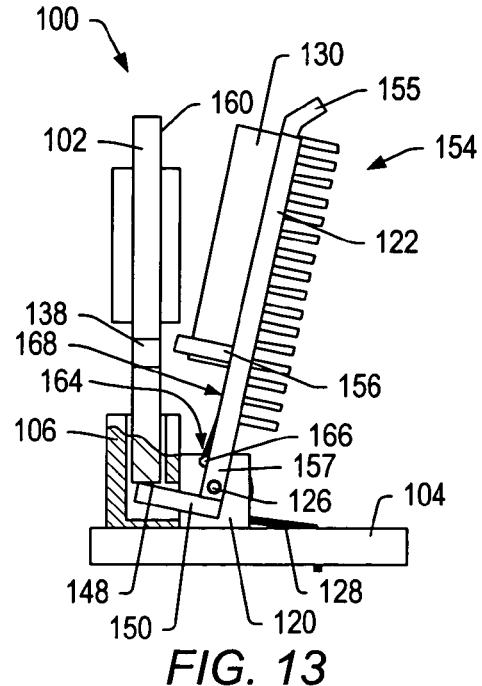
FIG. 13 is a cutaway view of the heat sink shown in FIG. 9 with the heat sink in an open position.

FIG. 12 depicts a cutaway view of circuit board 104, circuit module 102, and heat sink 154 when circuit module 102 is fully installed on circuit board 104. FIG. 13 depicts a cutaway view of circuit board 104, circuit module 102, and heat sink 154 when circuit module 102 is partially installed on circuit board 104. Only one of heat sinks 154 is shown in FIGS. 12 and 13 for clarity. Heat sink 154 may include legs 150 and handle 155. Legs 150 may extend into slot 108 in socket 106. Handle 155 may be grasped by a user to position heat sink 154 relative to circuit module 102.

When circuit module 102 is advanced during installation of circuit module 102 in socket 106, engagement of bottom edge 148 of circuit module 102 with legs 150 may rotate body 122 of heat sink 154 into engagement with side 160 of circuit module 102. As body 122 of heat sink 154 engages side 160 of circuit module 102, pins 156 may enter into notches 138 of circuit module 102, thereby locking circuit module 102 in socket 106.

During removal of circuit module 102, legs 150 may serve as ejectors for circuit module 102. Handle 155 may be used to move body 122 of heat sink 154 away from circuit module 102. As body 122 of heat sink 154 is moved away from circuit module 102, legs 104 may engage bottom edge 148 of circuit module 102, forcing circuit module 102 out of slot 108 in socket 106. Pins 156 may clear notches of circuit module 102, allowing circuit module 102 to be withdrawn from socket 106.

In some embodiments, a heat sink may include a holding device that maintains a portion of the heat sink in a desired position. For example, a holding device may hold body 122 of heat sink 154 in an open position during installation or removal of a circuit module 102 in socket 106. A holding device may in some embodiments be detent mechanism 164 shown in FIG. 13. Detent mechanism 164 may include spring-loaded balls 166. Spring-loaded balls 166 may engage interior surfaces 168 of tabs 157 on heat sink 154 to hold body 122 in an open position (FIG. 13). When sufficient closing force is applied to heat sink 154, spring-loaded balls 166 may be displaced from interior surfaces 168, allowing heat sink 154 to enter a closed position (FIG. 12).

In the embodiment shown in FIG. 9, the loads applied by heat sinks 154 on circuit module 102 act in opposite directions, and thus tend to offset one another. Including a spring-loaded heat sink on both sides of a circuit module may provide a relatively balanced load that minimizes stresses on elements of a system. For example, a balanced load may reduce bending stress in the circuit module 102 and/or socket 106. In other embodiments, a system may include other elements, such as brackets, rails, or ribs, to reduce loads applied by a heat sink. For example, in the single heat sink embodiment shown in FIG. 1, rails may be attached to circuit board 104 that engage upper side 114 of circuit module 102 to bear a portion of a load applied by heat sink 110 on circuit module 102. Lower stresses may reduce a risk of failure of the system, such as failure of solder connections between circuit board 104 and socket 106.

Figure 14:
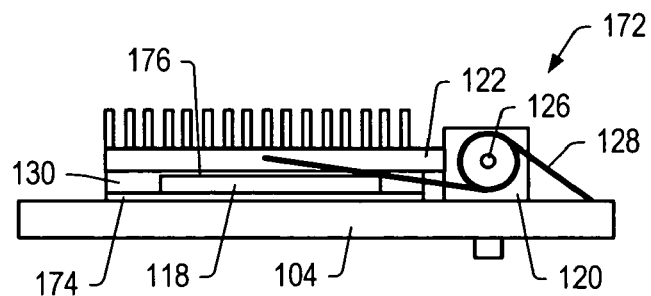
FIG. 14 is a spring-loaded heat sink for an integrated circuit device in a closed position.
Figure 15:
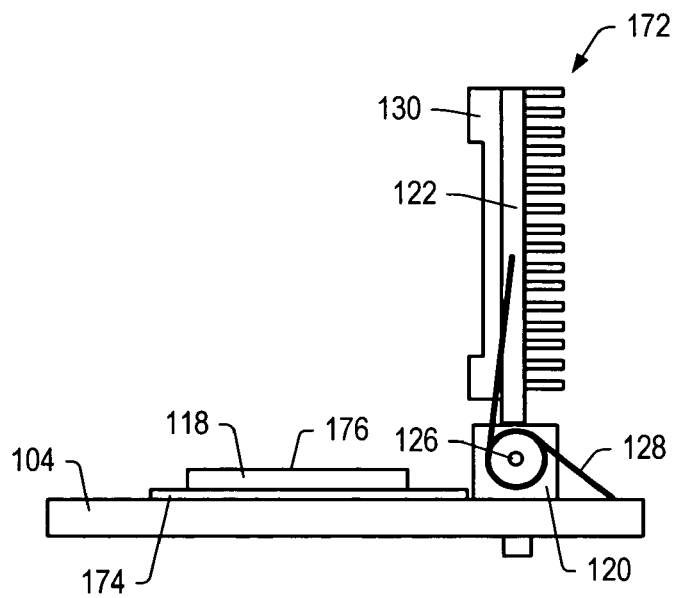
FIG. 15 is a spring-loaded heat sink for an integrated circuit device in an open position.

FIG. 14 depicts a system including a self-installing heat sink 172 for device 118 after the heat sink is coupled to the device. Socket 174 on circuit board 104 may receive device 118. Heat sink 172 may be coupled to circuit board 104 as described above relative to FIG. 1. FIG. 15 depicts heat sink 172 before the heat sink is coupled to device 118. In some embodiments, heat sink 172 may automatically install (e.g., by displacement of an ejector leg such as described above relative to FIGS. 12 and 13.) In other embodiments, heat sink 172 may be manually actuated from an open position to a closed position. When heat sink 172 is closed on device 118, thermal interface element 130 may contact top surface 176 of device 118. Torsion spring 128 may apply pressure to top surface 176 of device 118. In some embodiments, thermal interface element 130 may act as a filler to accommodate devices of varying sizes.

Although the system shown in FIGS. 14 and 15 depict only one device, it will be understood that in other embodiments, a heat sink could couple with multiple devices that are commonly mounted to a circuit board. Alternatively, a heat sink could couple with multiple devices, each of which is received in a separate socket on a circuit board.

Figure 16:
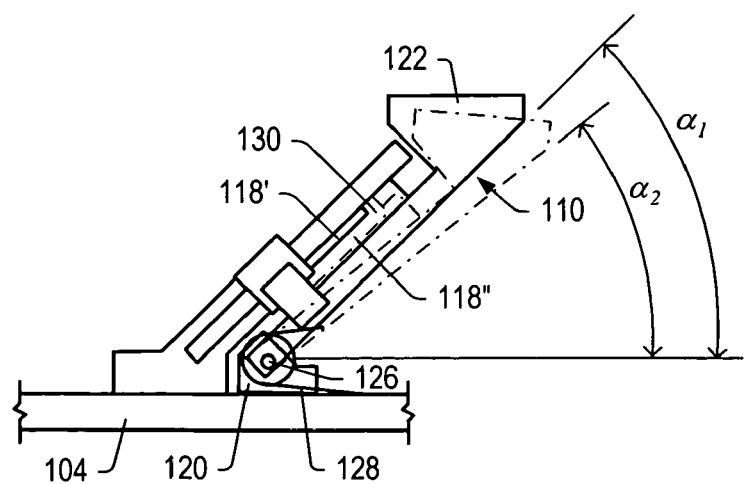
FIG. 16 is a spring-loaded heat sink for use with circuit board components of different sizes.

Relatively large devices tend to have higher capacities, and higher power densities, than smaller devices. In some embodiments, a heat sink may apply a greater pressure to relatively large (e.g., tall) devices than to relatively small (e.g., short) devices. For example, as shown in FIG. 16, body 122 of heat sink 110 may rest at angle $\alpha_1$ when installed on a circuit module including device 118', and at angle $\alpha_2$ when circuit module 102 is installed on a circuit module including device 118" (shown by phantom lines). In some embodiments, torsion spring 128 may be selected such that the force applied to circuit module 102 by heat sink 110 when body 122 is at angle $\alpha_2$ is greater than the force applied when body 122 is at angle $\alpha_1$. Thus, heat sink 110 may advantageously apply more pressure (resulting in lower thermal contact resistance) to larger devices having high power densities, and less pressure to smaller devices having low power densities.

In some embodiments, one or more heat pipes may be coupled to a heat sink to promote transfer of heat away from processors or other components on a module. Referring again to FIG. 5, heat sinks 110 may include heat pipes 178. In some embodiments, a heat pipe may be a separate element that is attached to a heat sink. In certain embodiments, two or more heat sinks may share a heat pipe.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "front," "rear," "vertical," "horizontal" "upward", "downward," "under", "over," "left," or "right" are used in the claims, they are to be understood to relate to the Figures as illustrated. However, the device may be turned at an angle to the horizontal or inverted with the quoted terms referring to the altered orientation. As another example, shared heat pipes as described herein may be incorporated into a set of modules carried on a converter cage assembly. As yet another example, a module mounted to an offset bracket may include a downstream power section as described herein.

What is claimed is:

1. A circuit board assembly comprising:
   a circuit board configured to receive a circuit module;
   a heat sink coupled to the circuit board, the heat sink comprising a body configured to couple to a surface of the circuit module; and
   a socket coupled to the circuit board, wherein the socket is configured to receive the circuit module at an acute angle relative to a plane of the circuit board.

2. The circuit board assembly of claim 1, wherein the body of the heat sink is configured to automatically couple to the surface of the circuit module when the circuit module is installed on the circuit board.

3. The circuit board assembly of claim 1, wherein the heat sink further comprises a biasing element, wherein the biasing element is configured to urge the body into contact with the circuit module when the circuit module is installed in the socket.

4. The circuit board assembly of claim 1, wherein the heat sink further comprises a base coupled to the circuit board, wherein the body is pivotally coupled to the base.

5. The circuit board assembly of claim 1, wherein the heat sink comprises a thermal interface element configured to contact the circuit module when installed.

6. The circuit board assembly of claim 1, wherein the heat sink comprises a thermal interface material, wherein the thermal interface material is configured to contact semiconductor devices of at least two different heights on the module.

7. The circuit board assembly of claim 1, further comprising a locking member configured to inhibit removal of the circuit module from the circuit board when the locking member is in a closed position, wherein the heat sink is configured to automatically couple with the circuit module when the locking member is actuated to a closed position.

8. The circuit board assembly of claim 7, wherein the heat sink comprises a cam element, wherein the locking member is configured to engage the cam element to decouple the body of the heat sink from the circuit module when the locking member is placed in an open position.

9. The circuit board assembly of claim 1, wherein the circuit board assembly comprises a plurality of angled circuit modules, wherein the heat sink is coupled to a lower side of one of the circuit modules between two adjacent circuit modules.

10. A circuit board assembly comprising:
    a circuit board configured to receive a circuit module;
    a heat sink coupled circuit board, the heat sink comprising a body configured to couple to a surface of the circuit module; wherein the body of the heat sink is configured to automatically couple with the surface of the circuit module when the circuit module is installed on the circuit board; and
    an ejector configurable to eject the circuit module.

11. The circuit board assembly of claim 10, wherein the ejector is coupled to the heat sink, wherein the ejector is configured to eject the circuit module when the body of the heat sink is decoupled from the circuit module by a user.

12. The circuit board assembly of claim 10, further comprising a locking member configured to inhibit removal of the circuit module from the circuit board, wherein the ejector is coupled to the locking member, wherein the ejector is configured to eject the circuit module when the locking member is moved to an open position.

13. The circuit board assembly of claim 10, wherein the body of the heat sink is configured to automatically decouple from a surface of the circuit module when the circuit module is removed from the circuit board.

14. The circuit board assembly of claim 10, wherein the body of the heat sink is configured to automatically decouple from a surface of the circuit module when the ejector is operated to eject the circuit module.

15. The circuit board assembly of claim 10, wherein the heat sink comprises a cam element, wherein the ejector is configured to engage the cam element to decouple the body of the heat sink from the circuit module.

16. The circuit board assembly of claim 10, wherein the ejector is configured to engage the circuit module when the circuit module is installed such that the heat sink couples with a surface of the circuit module.

17. The circuit board assembly of claim 10, further comprising a holding device configured to maintain the heat sink in an open position.

18. A heat sink, comprising:
   a base configured to couple with a circuit board;
   a body configured to couple with a surface of a circuit module installed on the circuit board, wherein the circuit module is installed on the circuit board at an acute angle; and
   a thermal interface element coupled to the body, the thermal interface element configured to conform to at least one component mounted on the circuit module.

19. The heat sink of claim 18, further comprising a biasing element configured to move the body with respect to the base to couple the body with the circuit module.

20. The heat sink of claim 18, wherein the body is configured to automatically couple to a surface of the circuit module when the circuit module is installed on the circuit board.

21. The heat sink of claim 18, further comprising a heat pipe.

22. The heat sink of claim 18, further comprising a biasing element configured to move the body with respect to the base to couple the body with the circuit module, wherein heat sink is configured to apply a larger force to a first circuit module having a first maximum device height than to a second circuit module having a second maximum device height, wherein the first maximum device height is greater than the second maximum device height.

* * * * *